(12) United States Patent
Sankaranarayanan et al.

(10) Patent No.: US 8,374,840 B2
(45) Date of Patent: Feb. 12, 2013

(54) SYSTEM AND METHOD FOR FEEDBACK-GUIDED TEST GENERATION FOR CYBER-PHYSICAL SYSTEMS USING MONTE-CARLO

(75) Inventors: Sriram Sankaranarayanan, Boulder, CO (US); Franjo Ivancic, Princeton, NJ (US); Aarti Gupta, Princeton, NJ (US); Truong X. Nghiem, Philadelphia, PA (US)

(73) Assignee: NEC Laboratories America, Inc., Princeton, NJ (US)

( * ) Notice: Subject to any disclaimer, the term of this patent is extended or adjusted under 35 U.S.C. 154(b) by 441 days.

(21) Appl. No.: 12/578,855

(22) Filed: Oct. 14, 2009

(65) Prior Publication Data

US 2010/0094611 A1 Apr. 15, 2010

Related U.S. Application Data

(60) Provisional application No. 61/105,064, filed on Oct. 14, 2008.

(51) Int. Cl.
*G06G 7/62* (2006.01)
(52) U.S. Cl. .......................................... 703/17
(58) Field of Classification Search ...................... 703/17
See application file for complete search history.

(56) References Cited

PUBLICATIONS

Sankaranarayanan et al.: State Space Exploration using Feedback Constraint Generation and Monte-Carlo Sampling; ESEC/FSE'07, Sep. 3-7, 2007, Cavtat near Dubrovnik, Croatia; pp. 321-330.*

Koushik et al.: CUTE: A Concolic Unit Testing Engine for C; ESECFSE' 05, Sep. 5-9, 2005, Lisbon, Portugal; pp. 1-10.*
Koushik et al.: Concolic Testing of Multithreaded Programs and Its Application to Testing Security Protocols; UIUC Technical Report # UIUCDCSR20062676; pp. 1-12.*
Appendix to specification of provisional application; pp. 1-3; 2008.*
Alur, et al. "Symbolic Analysis for Improving Simulation Coverage of Simulink/Stateflow Models". EMSOFT '08. Oct. 2008. Pages 89-98.
Kurzhanski, et al. "Dynamic Optimization for Reachability Problems". Journal of Optimization Theory and Applications. vol. 108. No. 2. Feb. 2001, pp. 227-251.
Lygeros. "On Reachability and Minimum Cost Optimal Control". Automatica. vol. 40, No. 6. Jan. 2004, pp. 1-11.
Sankaranarayanan, et al, "State Space Exploration Using Feedback Constraint Generation and Monte-Carlo Sampling". ESEC/FSE '07. Sep. 2007, pp. 321-330.
Satpathy, et al. "Randomized Directed Testing (Redirect) for Simulink/stateflow Models". EMSOFT '08. Oct. 2008, pp. 217-226.

* cited by examiner

*Primary Examiner* — Hugh Jones
(74) *Attorney, Agent, or Firm* — Bao Tran; Joseph Kolodka

(57) ABSTRACT

A system and method for generating test vectors includes generating traces of a system model or program stored in memory using a simulation engine. Simulated inputs are globally optimized using a fitness objective computed using a computer processing device. The simulation inputs are adjusted in accordance with feedback from the traces and fitness objective values by computing a distance between the fitness objective value and a reachability objective. Test input vectors are output based upon optimized fitness objective values associated with the simulated inputs to test the system model or program stored in memory.

5 Claims, 7 Drawing Sheets

SYSTEM AND METHOD FOR FEEDBACK-GUIDED TEST GENERATION FOR CYBER-PHYSICAL SYSTEMS USING MONTE-CARLO

RELATED APPLICATION INFORMATION

This application claims priority to provisional application Ser. No. 61/105,064 filed on Oct. 14, 2008, incorporated herein by reference.

BACKGROUND

1. Technical Field

The present invention relates to computer program verification systems and methods, and more particularly to systems and methods for model-based testing of cyber-physical systems.

2. Description of the Related Art

Cyber-physical systems are embedded systems featuring a combination of computational and physical elements. Many methods have been proposed for automatic test vector generation for state transition graphs of these systems. Specifically for cyber-physical systems, the test vector generation has largely been purely random. In pure discrete software systems, directed testing using concolic execution (concolic: concrete+symbolic) has become popular to generate tests with improved coverage. This concept has been extended to handle Simulink/Stateflow models using heuristical random searches to increase coverage of Stateflow states. Another approach has tried to focus on initial state coverage by performing a concrete and follow-up backwards symbolic execution for the case of deterministic systems.

A need exists for providing improved test generation coverage for cyber-physical systems.

SUMMARY

A system and method for generating test vectors includes generating traces of a system model or program stored in memory using a simulation engine. Simulated inputs are globally optimized using a fitness objective computed using a computer processing device. The simulation inputs are adjusted in accordance with feedback from the traces and fitness objective values by computing a distance between the fitness objective value and a reachability objective. Test input vectors are output based upon optimized fitness objective values associated with the simulated inputs to test the system model or program stored in memory.

A system and method for generating test vectors in cyber-physical systems includes generating traces of a system model or program of a mixed-discrete-continuous system stored in memory using a simulation engine, and globally optimizing simulated inputs using a fitness objective computed using a computer processing device. The simulation inputs are sampled in regions of state-space and are adjusted in accordance with feedback from the traces and fitness objective values by computing a distance between the fitness objective value and a reachability objective. Test input vectors are output based upon optimized fitness objective values associated with the simulated inputs to test the system model or program stored in memory.

A system for generating test vectors for cyber-physical systems includes a concrete simulation engine including a symbolic trace follower configured to generate partially symbolic traces of a system model or program of a mixed-discrete-continuous system stored in memory, the concrete simulation engine further configured to output concrete traces of the system model or program. A fitness objective is stored in memory and is computed using a computer processing device. An optimizer is configured to generate simulated inputs which are sampled in regions of state-space and optimizes the simulated inputs based on distances computed between fitness objective values and the target. A coverage selection tool is configured to determine targets and to output test input vectors in accordance with the optimized simulated inputs.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

The present principles combine the benefits of a random search and directed testing for the analysis of cyber-physical systems. A framework based on statistical sampling of inputs is guided by statically generated constraints that steer the simulations towards more "desirable" traces thus guiding the random search using feedback from earlier traces. The present approach works iteratively; each iteration simulates the system on some inputs sampled from a restricted space, while recording facts about the simulated traces. Subsequent iterations of the process attempt to steer the future simulations away from what has already been seen in the past iterations.

This is achieved in two separate ways, e.g.: (a) symbolic executions are performed to guide a choice of inputs, and (b) input space is sampled using, e.g., a Hit-and-Run Monte Carlo technique. As a result, the sampled inputs generate traces that are likely to be significantly different from the observations in the previous iterations. In particular, a notion of "failing distance" of uncovered constraints is utilized to steer the sampled inputs towards more desirable ones.

Formal verification of cyber-physical systems such as embedded devices is notoriously difficult due to inherent interaction between discrete and continuous components. Hence, to improve confidence in an embedded systems' safety and correctness, semi-formal techniques are employed to discover potential bugs or provide coverage measures.

These techniques include simulation, symbolic execution, and test vector generation, for example. The type of system description can vary from the formal hybrid automata representation to widely used Simulink/Stateflow models. The tests obtained in such a manner (model-based testing) can then be used to guide the simulation on models or run tests on the cyber-physical system directly.

Embodiments described herein may be entirely hardware, entirely software or including both hardware and software elements. In a preferred embodiment, the present invention is implemented in software, which includes but is not limited to firmware, resident software, microcode, etc.

Figure 1:
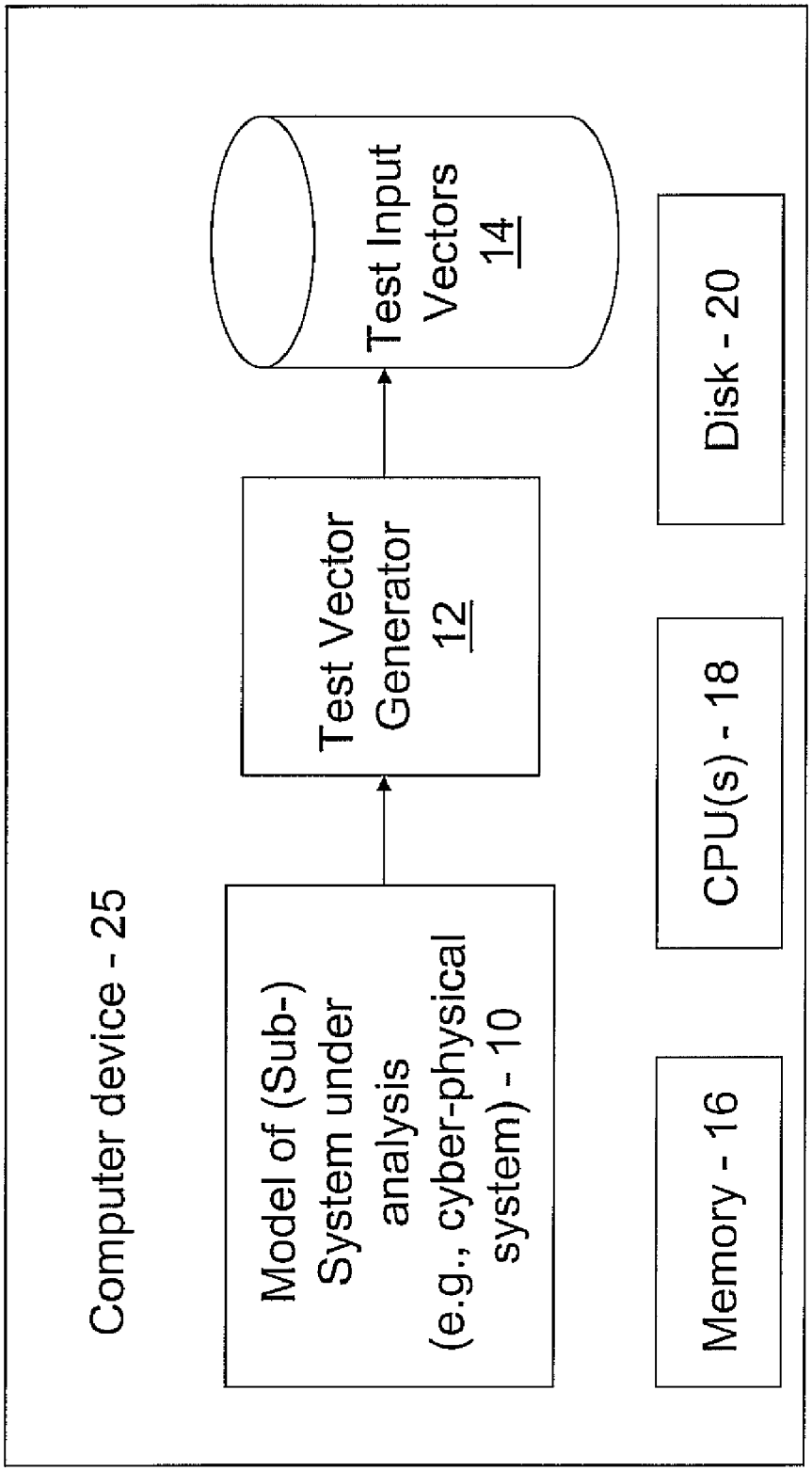
FIG. 1 is a block diagram showing a high-level test vector generation framework employed in accordance with one embodiment.

Referring now to the drawings in which like numerals represent the same or similar elements and initially to FIG. 1, an illustrative diagram shows a high-level system 50 and flow for implementing a test generation embodiment of the present invention. In block 10, models of a system or sub-system are provided which will be tested by a testing program. A test generator 12 analyzes the inputs to determine an appropriate set of test vectors that may be employed to test the system or sub-system, and outputs the test input vectors 14. The test vectors 14 will be employed to test the system or sub-system. The vector generation framework 50 depicted in FIG. 1 may be performed using a general purpose computer 25 with memory 16, a computer processing unit IB and/or a disk for permanent or portable memory or to provide the system or sub-system for test.

Figure 2:
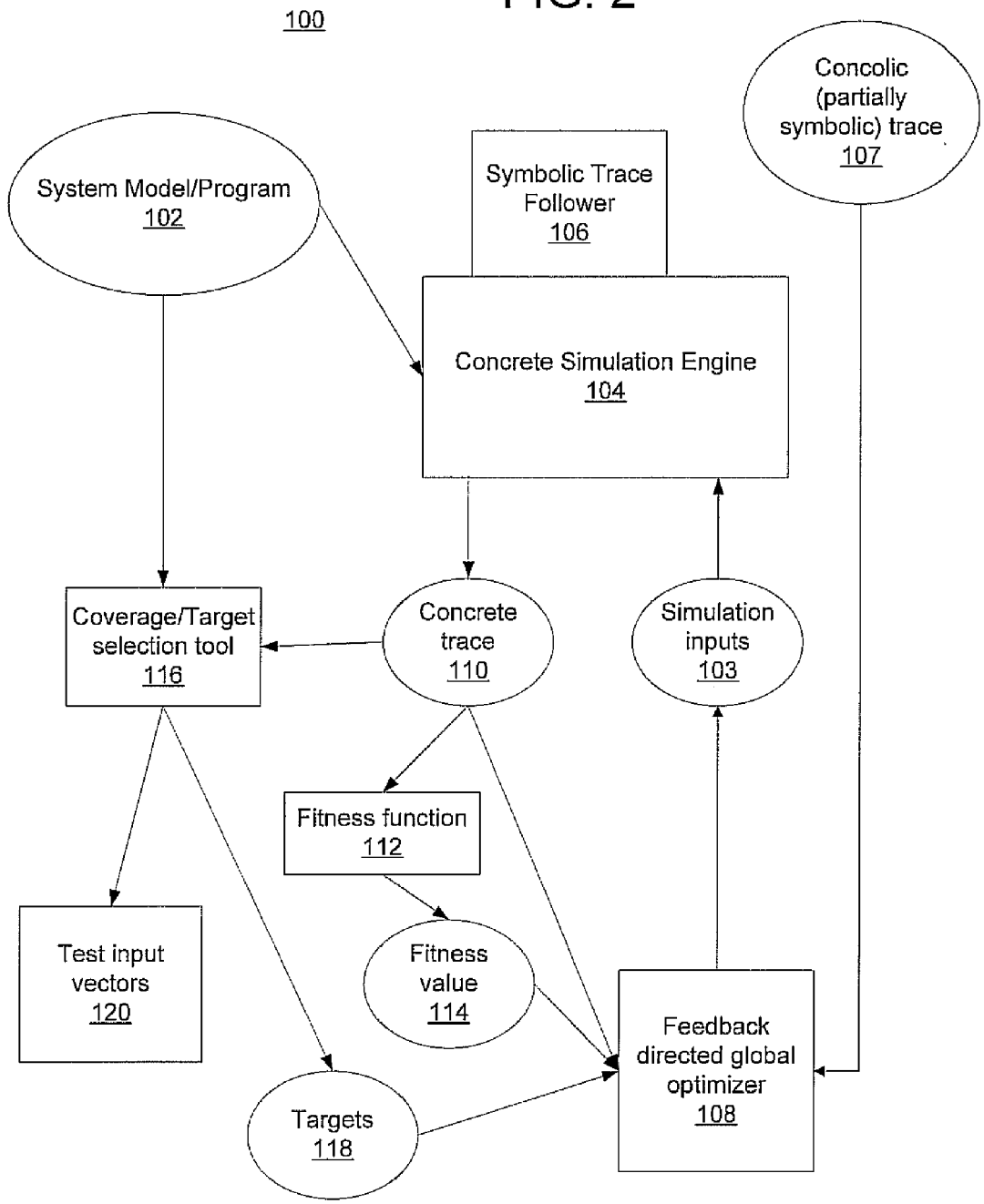
FIG. 2 is a block diagram showing a more detailed test vector generation framework in accordance with another embodiment.

Referring to FIG. 2, a test vector generation framework 100 is shown in greater detail. In block 102, a system or sub-system model is provided describing a program. The system or sub-system model models any program but in particularly useful embodiments a model a cyber-physical system is employed. A concrete simulation engine 104 analyzes the system model 102 to generate traces from program executions. A symbolic trace follower 106 follows the symbolic execution of the program to determine concolic traces 107. The concolic traces 107 are input to a feedback directed global optimizer 108, which generates simulation inputs 103 for the simulation engine 104. Concrete traces 110 are output to a fitness function or functions 112 to determine fitness values 114. The fitness values 114 are employed for comparison against targets 118 generated by a coverage/target selection tool 116. The target coverage tool 116 steers the targets to ensure proper range coverage for the simulated inputs 103 and maintains the adequacy of the present state of the test domain, among other things. The fitness value 114 is provided to the optimizer 108 which computes a distance between a target 118 and the fitness value 114. The optimizer 108 uses the distance as and indicator or metric to adjust the simulated inputs 103 which are then feed back to the simulation engine 102 to provide additional traces. Determined trace distances are compared to fitness values. The coverage tool and target selection module 116 employs the system model 102 and input criteria to determine targets 118 in the program that need to be tested or need additional or reduced attention in testing. A target(s) 118 is output and sent to the optimizer 108. The optimizer 108 iterates over its inputs including sampling of concolic traces 107 and concrete traces 110 to refine the simulation inputs 103 in a next iteration. The coverage tool 116 identifies discrete targets, continuous region targets and/or mixed discrete-continuous targets to ensure all targets have been appropriately covered. This information is also provided to the optimizer 108. The result achieves an improved set of test input vectors 120, which are output and stored for use in testing the system or program, as needed.

The system 100 utilizes the view that reachability of a target assertion 118 for a given non-linear system 102 can be viewed as an optimization of a fitness objective 112 measuring a distance between a given trace and the reachability objective. This finds analytical solutions for a sub-class of systems. In the present case, a best-effort generic implementation is provided that attempts to answer reachability questions based on a global optimization objective based on the fitness function 112. One advantage is addressing the issue for arbitrary system models or programs (102) (no restriction on what is being considered). The present embodiments employ a failed distance to compute a fitness value 114, as well as a "Hit-and-Run" Monte-Carlo based sampling in a hybrid discrete-continuous space to drive the global optimization.

A very non-intrusive implementation of the symbolic trace follower 106 attaches itself to the concrete simulation engine 104. In many cases, available industrial tools such as Simulink/Stateflow from the MathWorks exist that have highly non-trivial (and non-formal) semantics. Hence, other approaches to generating symbolic traces are unlikely to be correct and stable with future releases of these tools. By directly attaching to the present simulator 104 (or its future versions) we are able to avoid these pitfalls.

The present principles apply to any system or program, in general. However, they may be improved considerably using information gained from the system's execution to narrow the search space. Therefore, we focus on hybrid systems as a system model (102) that will be used to present our techniques.

Hybrid Systems. To model hybrid systems we use hybrid automata. For the time being, we restrict ourselves to autonomous hybrid systems. Non-autonomous systems are considered later.

Definition 1 (Hybrid Automaton). A hybrid automaton $\psi$ $\langle n, L, T, \theta, D, T, l_0 \rangle$ consists of the following components:

n is the number of continuous variables. These variables are denoted by the set $V=\{x_1, \ldots, x_n\}$.

L, a finite set of locations; $\ell_0 \in L$ is the initial location;

T, a set of (discrete) transitions. Each transition $\tau \langle l_1 \rightarrow \ell_2, \rho_r \rangle \in T$ consists of a move from $\ell_1 \in L$ to $\ell_2 \in L$, and an assertion $\rho_r$ over $V \cup V'$, representing the transition relation;

Assertion $\theta$, specifying the initial values of time continuous variables;

D, mapping each $\ell \in L$ to a vector field $D(\ell)$, specifying the continuous evolution in location $\ell$;

I, mapping each $\ell \in L$ to a location invariant, $I(\ell)$.

A computation of a hybrid automaton is an infinite sequence of states $\langle \ell, x \rangle \in L \times \Re^1$ of the form $\langle \ell_0, x_0 \rangle$, $\langle \ell_1, x_1 \rangle, \langle \ell_2, x_2 \rangle, \ldots$, such that the initiation condition $\ell_0 = \ell_0$ and $x_0 \in [[\theta]]$ holds, and for each consecutive state pair $\langle l_i, x_i \rangle$, $\langle l_{i+1}, x_{i+1} \rangle$, satisfies the consecution conditions: 1. Discrete Consecution: there exists a transition $\tau: \langle \ell_1, \ell_2, \rho_r \rangle \in T$ such that $l_i = \ell_1$, $\ell_{i+1} = \ell_2$, and $\langle x_i, x_i + 1 \rangle \in [[\rho_r]]$, 2. Continuous Consecution: $l_i = \ell_{i+1} = \ell$, and there exists a time interval $[0,\delta)$, $\delta > 0$, and a time trajectory $\tau:[0\delta] \rightarrow R^n$, such that $\tau$ evolves from $x_i$ to $x_{i+1}$ according to the vector field at location $\ell$, while satisfying the location condition $I(\ell)$. Formally, 1. $\tau(0) = x_1$, $\tau(\delta) = x_2$, and $(\forall t \in [0,\delta])$, $\tau(t) \in [[I(\ell)]]$, 2.

$$(\forall t \in [0, \delta)), \left. \frac{d\tau}{dt} = D(l) \right|_{x=\tau(t)}.$$

A hybrid automaton $\psi$ is deterministic if starting from some initial state $\langle \ell_0, x_0 \rangle$ there exists a unique computation of the automaton. Throughout this disclosure, unless otherwise mentioned, we will consider deterministic hybrid systems for simplicity.

Reachability. Given a hybrid system $\psi$ over a state-space $x \in R^m$, a safety property $\phi$ consists of an assertion $\phi$ over $x$ such that $[[\phi]] \subseteq R^n$. We will also consider location-specific reachability properties of the form $\langle \ell, \varphi \rangle$ that additionally includes a location $\ell$ of the system. For a safety property, $\langle \ell, \varphi \rangle$ the reachability problem consists of finding a computation of the system $\psi$ starting from some valid initial state $\langle \ell_0, x_0 \rangle$ such that at some time instant $t>0$, the computation reaches a state $\langle \ell, x(t) \rangle$ such that $x(t)|=\phi$.

The problem of reachability is undecidable for general hybrid automata. In practice, severe restrictions need to be placed on the model to obtain decidability of the reachability problem. Therefore, most attempts at solving the reachability problem primarily focus on finding a proof that the system is unreachable using over-approximations or finding counter-examples of failures of reachability using under-approximations. The present illustrations use under-approximations and concrete simulations to perform a best effort search for counter-examples. Specifically, it cannot be used as such to find proofs of unreachability.

Global Optimization: We provide the basic formulation of reachability in terms of global optimization and describe a technique based on simulated annealing to carry out this global optimization over the space of system trajectories.

Let $\psi$ be a given (deterministic) system with an (input) state-space x. Let P:$\phi$ be a safety property. Definition 2 (Fitness Metric). A fitness metric $f_P$ for a property P is a function that associates each computation of the system $\psi$ with a fitness value. The function $f_p$ is an indicator for a property P iff $f_P(c) \leq 0$ for each computation c that reaches P, and conversely for each computation c, not reaching P, $f_P(c) > 0$.

Given a computation c and property P, a simple, admissible fitness function can be obtained as $f_P(c)=1$ if c does not reach P and $f_P(c)=0$ if c reaches R. However, such a simplistic definition does not help overall reachability goals (as will be seen subsequently). Thus far, we have defined the notion of the fitness function 112 over computations of a system 102. However, for deterministic systems, we may lift the notion from computations to input values naturally as follows: $f_P(x_0)=f_P(c)$, c is the computation resulting from initial valuation $x_0$.

This permits us to refer to fitness functions as functions over reals for non-deterministic systems if it possible to lift fitness functions to initial values by aggregating the set of all resulting computations. In general, we may define: $f_P(x_0)=\Im$ ($\{f_P(c) | c$ is a computation resulting from the initial valuation $x_0\}$), wherein $\Im$ is a functional defined over (potentially infinite) sets of real numbers. The functional $\Im$ may be defined as a limit (e.g., $\Im=$lim inf), a summation or a product which could be estimated numerically. However, we continue to focus on deterministic systems.

An indicator fitness function $f_P$ allows us to pose the reachability of P as a (possibly constrained) optimization problem (for deterministic systems):

min. $f_P(x_0)$ s.t. $x_0 \in [[\theta]]$.

Let v be an optimal solution for the problem above. If $v \leq 0$, we obtain a witness for reachability from the optimal solution. On the other hand, if $v>0$, we may conclude unreachability of the property P. The optimality of the solution lets us conclude unreachability. In practice, however, we may only hope to approximate the optimal solution $f_P(x_0)$. If some solution $f_P(x_0) \leq 0$ exists then we conclude a witness to reachability. On the other hand, if we can dualize the optimization problem and obtain a positive lower-bound on the optimal value, we may conclude unreachability. The ability to solve reachability problems through optimization for a given system $\psi$ depends on the definition of $f_P$. Informally, fitness values 114 for computations that do not reach the property P should provide information that should guide the search.

EXAMPLE 1

Consider a discrete system $\psi$ with a two locations $\ell_0, \ell_1$ with a single enabled discrete transition $x'=g(x)$ that goes from location $\ell_0 \to \ell$, for some smooth and convex function g. We consider a reachability objective P: $\ell \langle_1, (x+x^*) \rangle$.

Consider the indicator fitness function $g_P$ such that $g_P(x_0)=\|g(x_0)-x^*\|$ that measures the distance of the reached point from the target of $x^*$. Since g is a convex function, it follows that $g_P$ is convex over x. It follows that the optimization problem: min $g_P(x_0)$ s.t. $x_0 \in [[\theta]]$, can be solved efficiently, in many cases, through gradient descent.

Consider, on the other hand, a fitness function $f_P$:

$$f_P(x_0) = \begin{cases} 1 & g(x_0) \neq x^* \\ 0 & g(x_0) = x^* \end{cases}$$

The function $f_P$ also acts as an indicator function for the reachability of the target point $x^*$, evaluating to 0 if the target is reached and 1 otherwise. The optimization problem obtained through the function $f_P$ is difficult to solve.

In theory, it is desirable to define fitness functions that are computable, smooth, and convex. In practice, the undecidability of the general reachability problem means that such functions are seldom definable. Therefore, we will use global optimization techniques that do not rely on the fitness function (objective) 112 possessing these properties. On the other hand, we will define good fitness functions for hybrid systems that will enable the global optimization techniques to work well in practice.

Monte-Carlo Sampling: We now present Monte-Carlo sampling as a technique for global optimization of an objective function. Other sampling techniques may also be employed. These techniques are based on acceptance-rejection sampling. We first present the basic sampling algorithm and then the technique of hit-and-run sampling that respect the (convex) constraints on the input space due to $\theta$. Let $f_P(x)$ be a computable indicator function given a property P that we seek to minimize over a range of input values denoted by $[[\theta]]$. We sample points from the input space such that two points a, b with fitness values $f_P(a)$ and $f_P(b)$ are sampled with probability proportional to $$\frac{e^{-\beta f_P(a)}}{e^{-\beta f_P(b)}},$$

for a suitably chosen temperature parameter $\beta>0$. As a result, points with lower values of $f_P$ are sampled with a higher probability as compared to points with a higher value of the fitness function.

Method 1 shows a schematic illustrative implementation. At each step, the method generates a new proposal x' from the current sample x using some proposal scheme defined by the user. Subsequently, we compute the ratio $a=e^{-\beta(f(x')-f(x))}$ and accept the proposal randomly, with probability $\alpha$. Note that if $\alpha \geq 1$ (i.e., $f(x') \leq f(x)$), then the proposal is accepted with certainty. Even if $f(x')>f(x)$, the proposal may still be accepted with some non-zero probability. If the proposal is accepted then x' becomes a new sample. Failing this, x maintains the current sample.

A proposal scheme is defined by a probability distribution P(x'|x) that specifies the probability of proposing a new sample input x' given the current sample x.

METHOD 1

Monte-carlo sampling.

Input: θ: Input Space, f(•): Fitness Function, ProposalScheme(•): Proposal Scheme
Result: Samples ⊆ θ
    begin
        Choose some initial input x ∈ θ .
        while (¬reachTarget) do
            /* Select x' using ProposalScheme      */
            x' ← ProposalScheme(x)
            α ← exp (−β(f(x')− f(x)))
            r ← UniformRandomReal(0, 1)
            if (r ≤ α) then      /* Accept proposal?    */
                x ← x'
                if (f(x) ≤ 0) then reachTarget := true
            else
                /* Reject & seek fresh proposal
        */
    end For a technical reason (known as detailed balance), the present version of method 1 provides that P(x'|x)=P(x|x'). Furthermore, given any two inputs $x,x' \in [[\theta]]$, it should be possible with nonzero probability to generate a series of proposals x, $x_1$, ..., x' that takes us from input x to x'.

Suppose Method 1 was run to generate a large number of samples n. Let η, denote the frequency function $\eta: 2^{[[\theta]]} \mapsto N$ mapping a set of inputs to the number of times sample was drawn from the set. Let P(x) denote the probability density function for a sample around the point x, defined through the limit $$P(x) = \lim_{n \to \infty, h \to 0} \frac{\eta([s, s+h])}{h}.$$

Theorem 1. Let P be the sampling distribution function obtained in the limit. For inputs $x_1, x_2 \in \theta$, $$\frac{P(x_1)}{P(x_2)} = e^{-\beta(f(x_1) - f(x_2))}.$$

As a direct consequence, one may conclude, for example, that an input x with $f(x)=-100$ is much more likely to be sampled as compared to some other input $f(x)=100$ in the long run. The method itself can be seen as a gradient descent wherein at each step a new point x' in the search space is compared against the current sample. The probability of moving the search to the new point follows an exponential distribution on the difference in their fitness values (114): $f_P(x')-f_P(x)$. In particular, if $f_P(x') < f_P(x)$, the new sample is accepted with certainty.

It is possible to prove assertions about the number N of samples needed for the sampler to converge within some "distance" to the desired distribution governed by $e^{-\beta f_P(x)}$. The acceptance rejection sampling method implicitly defines a (continuous time) Markov chain on θ, whose invariant distribution is the desired distribution, we would like to sample from. For the case of discrete input spaces, the convergence is governed by the mixing time, which is invariably large, depending on the sampling scheme used.

Adjusting β. One of the main drawbacks of the Method 1 is that depending on the nature of the distribution, the samples may get stuck in local minima, resulting in numerous attempts with very few accepted samples. We therefore need to adjust the value of β to ensure that the ratio of accepted samples versus rejected samples remains close to 1. This is done during the sampling process by periodically monitoring the acceptance ratio and tuning β based on it. A high acceptance ratio indicates that β needs to be reduced, while a low acceptance rate indicates that β needs to be increased.

Proposal Schemes. It is relatively simple to arrive at viable schemes for generating new proposals. However, designing a scheme that works well for the underlying problem may need a process of experimentation. For example, it suffices to simply choose an input x' uniformly at random from among the inputs, regardless of the current sample. However, such a scheme does not provide many advantages over uniform random sampling. In principle, given a current sample x, the choice of the next sample x' depends upon x. A simple scheme could for instance choose a normal distribution centered at x with a suitably adjusted standard deviation. However, it is difficult to ensure that $x' \in [[\theta]]$ using this scheme.

Figure 3:
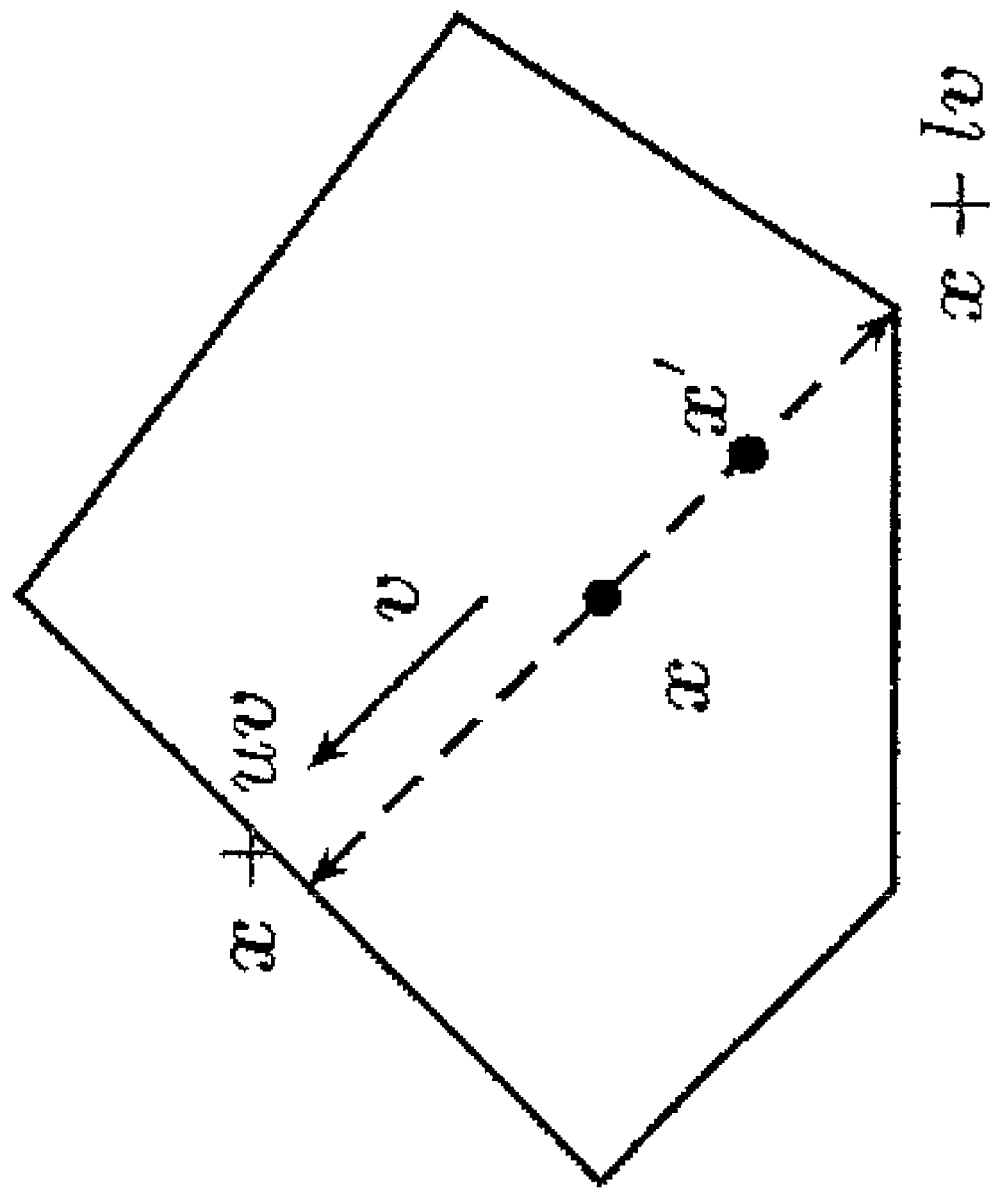
FIG. 3 is a diagram demonstrating hit and run sampling in accordance with one embodiment.

Hit-and-run proposal scheme. Referring to FIG. 3, hit-and-run schemes are useful in the presence of input domains such as θ. For simplicity, we assume that θ is convex. Therefore, any line segment in some direction v starting from x has a maximum offset u such that the entire segment between x and x+uv lies inside $[[\theta]]$. At each step, we propose a new sample x' based on the current sample x. This is done in two steps: (1) choose a random direction vector v uniformly from a set of vectors $v \in [0,1]^n$. After choosing a vector v, we discover the range [l,u] such that for all $\lambda \in [l,u], x+\lambda x \in [[\theta]]$. In other words, v yields a line segment containing the point x along the directions ±v and [l,u] represent the minimum and maximum offsets possible along the direction v starting from x. The value of l (resp. u) may be obtained by solving the convex programs: min(max) λ s.t. $x+\lambda x \in [[\theta]]$.

After choosing a direction v and discovering the range [l,u], we choose a value $\lambda \in [l,u]$ based on some fixed probability distribution with a mean around 0. For example, a Gaussian distribution centered around 0 with a standard deviation based on |u−l| can be used, provided samples drawn from outside the range [l,u] are discarded.

Hit-and-run samplers can also be used for non-convex input domains such as unions of polytopes and so on.

Fitness Functions: We illustratively present fitness functions for computations obtained by continuous systems.

Metrics for Continuous Systems: Consider a continuous system defined by an ordinary differential equation (ODE)

$$\frac{dx}{dt} = f(x),$$

initial condition $x_0 \in [[\theta]]$ and property $P: [[\phi]] \subseteq R^n$. We assume that each function $f_i$ is Lipschitz continuous. Therefore, there exists a unique function $\Im: R^n \times R \mapsto R^n$ for all $x_0 \in [[\theta]]$, representing the time solutions to the ODE such that $\Im(x_0, 0) = x_0$, and $\Im(x_0, t)$ represents the state reached at time t>0 starting from a given initial point $x_0$. In a few cases, the function $\Im$ is known analytically (for instance, linear ODEs). However, even when the analytical form of $\Im$ is known, it may be hard to represent and compute. Therefore, time-trajectories have to be approximated numerically.

We assume an approximate simulation function G that supports robust event detection with respect to (w.r.t) the unsafe states $[[\psi]]$. In other words, it is possible to choose the time instances T and the simulation function G such that if $\exists t>0, \Im(x_0,t)\in[[\psi]]$, then $\exists t'\in T, \epsilon<0$, s.t. $\|G(x_0,t')-\Im(x_0,t)\|\leq\epsilon$. The set of time instances T can be chosen to guarantee a given tolerance $\epsilon$. An appropriate simulation function can be obtained for a large class of ODEs using numerical simulation techniques of an appropriate order such as Runge-Kutta or Taylor-series methods with adaptive step sizes. Numerical integration schemes can also be adapted to provide reliable bounds e on the distance between the actual and the numerical solution.

Given a simulation scheme G and a time-set T, we obtain a trace $G_T(x_0)$ as a set of points $\{G(x_0,t)|t\in T\}$. Let $\delta_P(x)$ be a distance metric that measures the distance between a point x and a set $[[\phi]]$, such that $\delta_P(x)=0$ iff $x\in[[\phi]]$. For example, $\delta_P$ could be defined as the Haussdroff distance w.r.t the Euclidean norm.

Definition 3 (Trace Distance Function). The trace distance function $f_P$ is defined for a simulation scheme G for a set of time instances T and an underlying point-to-set distance metric $\delta_P$. $f_P(x_0)=\min\{\delta_P(x)|x\in G_T(x_0)\}$.

Unfortunately, the trace distance function is no longer an indicator for $\psi$. However, it can be made an $\epsilon$-indicator:

Definition 4 ($\epsilon$-indicator). A function $f_P: [[\theta]] \mapsto R$ is an $\epsilon$-indicator w.r.t $[[\psi]]$ iff $f_P(x_0)\leq\epsilon$ if the computation c starting from reaches $x_0$ and $\psi$, and $f_P(x_0)>0$, otherwise.

Given a $\epsilon$-indicator $f_P$, we may conclude that whenever $f_P(x_0)\leq 0$, the property $\psi$ is reached (with certainty). Similarly, if $f_P(x_0)>\epsilon$, the resulting computation does not reach the error. The interval $(0,\epsilon]$ is the range of uncertainty wherein we may not conclude a violation or otherwise with certainty.

We assume a simulation function G that chooses time instances T so that the resulting trace distance function is an $\epsilon$-indicator fitness function (112, FIG. 2)) for any fixed $\epsilon>0$. One way to build such a simulator is to use a guaranteed integrator that can produce safe bounds on the different errors and adapt its time step to yield a computation that respects some existing tolerance bound.

The overall optimization problem remains the same: min. min. $\{\delta_P(x_1)|x_1=G(x_0,t),t\in T\}$ s.t. $x_0\in\theta$. In practice, we may decompose this as the minima of |T| different optimization problems given that the set T is finite. This yields the following basic optimization: min. $\delta_P(G(x_0,t))$ s.t. $x_0\in[[\theta]]$.

EXAMPLE 2

Figure 4:
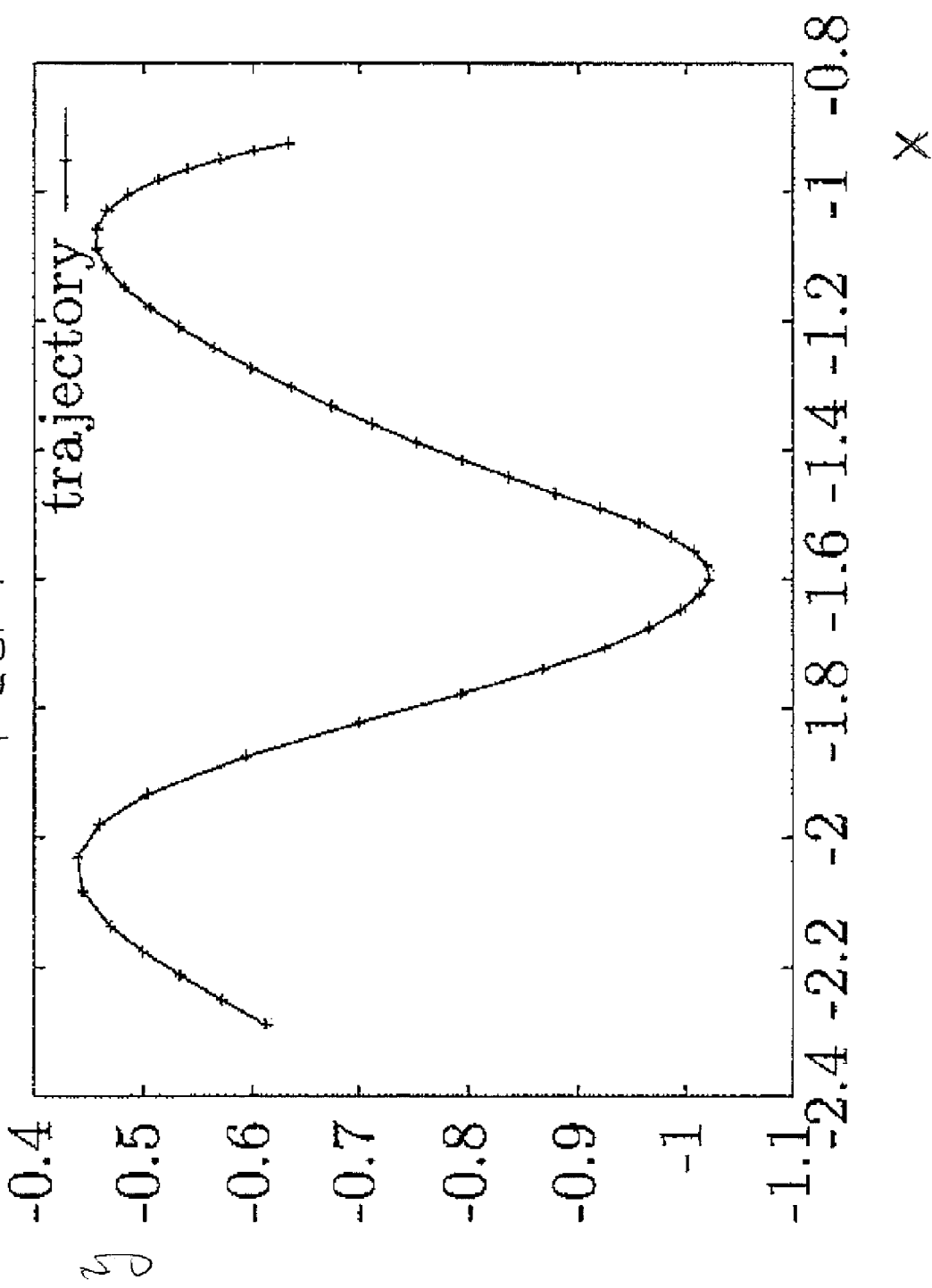
FIG. 4 is a diagram showing a time trajectory closest to a target point (−1.5, −1)

Consider the time variant system:

$$\frac{dx}{dt} = x - y + 0.1t$$

$$\frac{dy}{dt} = y\cos(2\pi y) - x\sin(2\pi x) + 1.0t$$

with the initial condition $(x,y)\in[-1,1]\times[1,1]$. We wish to find a point that reaches the target point $(-1.5,-1.0)$. Our simulation uses a numerical ODE solver with a fixed time step over the time interval $t\in[0,2]$. The fitness function (112) consists of the minimal Euclidean distance between the time trajectory and the target. FIG. 4 shows the trajectory that approaches the closest to the target point using 10,000 samples (best fitness:

0.003), generated using the hit-and-run sampler. Samples were generated by a Monte-Carlo sampler.

Non-autonomous Systems: We now consider extension control systems of the form $\dot{x}=f(x,u)$, with time varying inputs $u:[0,T] \mapsto R^m$ constrained to belong to a measurable set of functions U. One goal is to recast the reachability problem in the presence of control inputs u to reachability under a set of parameters $\lambda_u\in R^k$ that lie in some domain $[[\Gamma]]$, so that each valuation to the parameters $\lambda\in[[\Gamma]]$, results in the choice of appropriate control inputs $u(\lambda)\in U$. Such a parameterization may not capture all the control inputs possible in the set U, but necessarily restricts us to a subset of inputs.

Given a (continuous) control system with inputs $u\in U$, there are many ways to parameterize the space of control inputs.

Piece-wise Constant Control. We partition the overall time interval [0,T] into a set of intervals $U_{i-1}^m[t_{i-1},t_i)$, wherein $t_0=0$ and $t_m=T$. For each interval $[t_{i-1},t_i)$ the control u(t) is restricted to be a constant value $\lambda_{i-1}$. The control is therefore parameterized by the tuple $\langle \lambda_0, \ldots, \lambda_m \rangle$, chosen so that the constraints in U are respected.

Piece-wise Linear Control. Piece-wise constant control may be extended to piecewise linear controls and beyond. Once again, we partition [0,T] into m disjoint intervals. For each interval $[t_{i-1},t_i]$, we restrict the form of each control input to be piece-wise linear: $u(t_{i-1}+\delta)=u(t_{i-1})+\lambda_{i-1}\delta$. This effectively yields the parameters $\langle u(0),\lambda_0,\ldots,\lambda_m \rangle$ that define the control inputs. These parameters are chosen so that the resulting controls respect the constraints in U. Extensions to this scheme can introduce higher-order parameters of the form $u(t_{i-1}+\delta)=u(t_{i-1})+\delta\lambda_{i-1}^1+\delta^2\lambda_{i-1}^2$ and so on.

Template Functions. We may choose a template function $v(x,\lambda)$ over a set of parameters $\lambda$ and seek to express each control input $u(x)=v(x,\lambda_0)$ for some instantiation of the parameters $\lambda=\lambda_0$. For example, v may be chosen to be a multi-variate polynomial of a fixed degree over x with unknown coefficients $\lambda$.

EXAMPLE 3

Aircraft Model

We consider a simple aircraft model describing the movement of an aircraft as a particle in the vertical plane, taken directly from previous work of Lygeros, J. in "On Reachability and Minimum Cost Optimal Control" *Automatica* 40, (2004), pages 917-927. The equations of motion can be described by the ODE:

$$\dot{x} = \begin{bmatrix} -\frac{S\rho B_0}{2m}x_1^2 - g\sin(x_2) \\ \frac{S\rho C_0}{2m}x_1 - g\frac{\cos(x_2)}{x_1} \\ x_1\sin(x_2) \end{bmatrix} + \begin{bmatrix} \frac{u_1}{m} \\ 0 \\ 0 \end{bmatrix} + \begin{bmatrix} -\frac{S\rho}{2m}x_1^2(B_1u_2 + B_2u_2^2) \\ \frac{S\rho C_1}{2m}x_1u_2 \\ 0 \end{bmatrix}$$

with state-space variables $x_1$ describing the aircraft speed, $x_2$ describing its flight path angle and $x_3$ describing its altitude. The control inputs $u_1$ represent the thrust and $u_2$ represents the angle of attack. Numerical values for the parameters are as described by Lygeros.

The initial values for x are assumed to be in (200,260] x (-10,10] x (120,150]. The time interval of interest was taken to be [0, 3.0]. This was divided into 8 sub-intervals and the control inputs were parameterized to be piece-wise constant (yielding 16 extra parameters). We wish to find a control input that minimizes the distance to the point (240, 10, 50), i.e., reach a low altitude with the maximum flight path angle.

Figure 5:
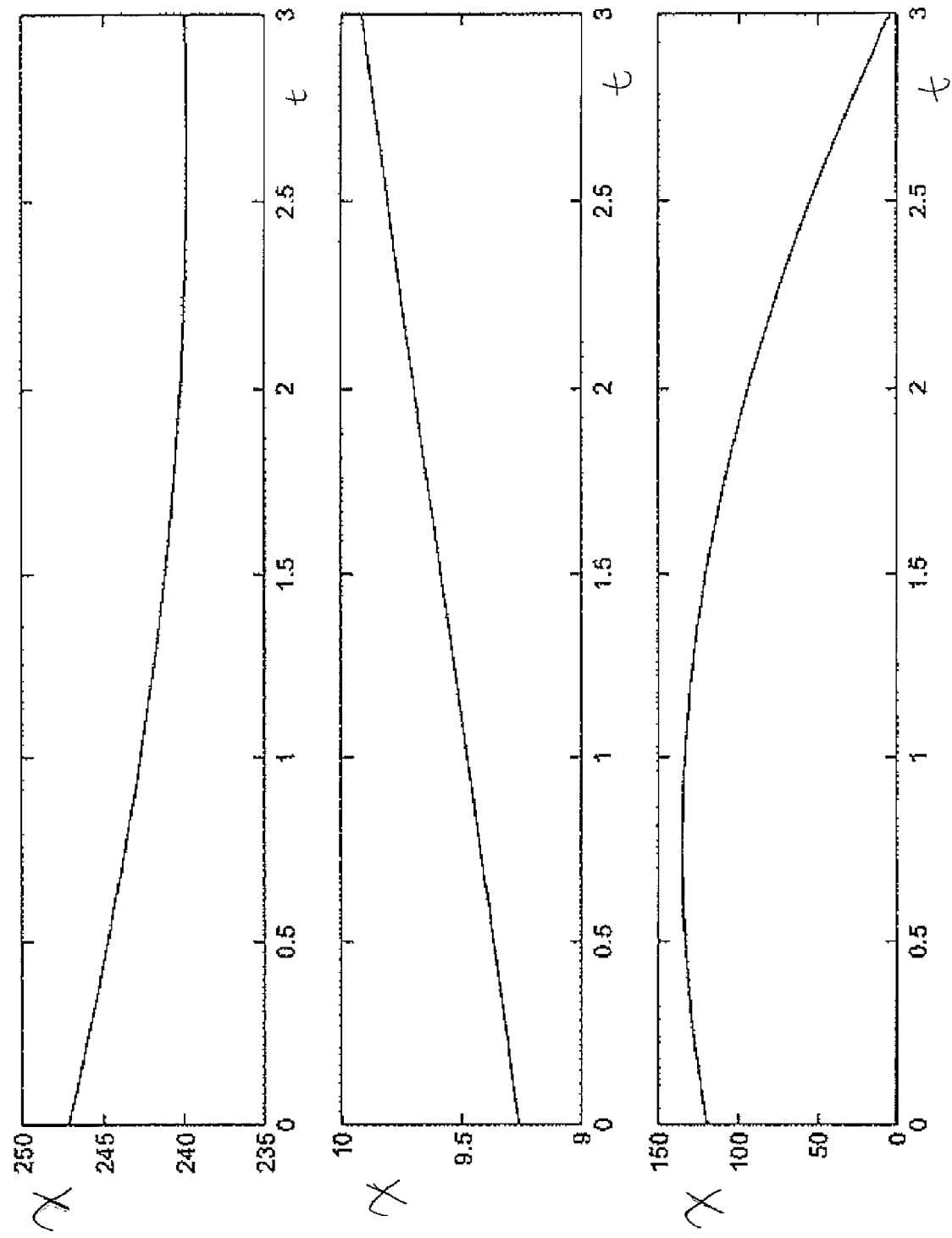
FIG. 5 is a diagram showing x versus time trajectories in aircraft example 3.

Overall the search problem, has 19 input parameters. A hit and run sampler was used for 25,000 steps, resulting in roughly 13,000 samples. The trajectories for x are plotted against time in FIG. 5. Note that at time t~2.5, the trajectory approaches quite close to the desired target point.

Extension to Hybrid Systems: The above framework can be extended directly to hybrid systems for properties of the form P:φ that require the reachability of a particular set of states, regardless of the system location. Given a deterministic hybrid system ψ, with input state space $x_0$, let $G(x_0,t)$ represent a simulation function for a set of time instances T such that G approximates the trajectories of the hybrid systems. We assume that G approximates the time trajectories with some given tolerance bound of ε by adjusting the integration method. In practice, this may be harder to achieve than for purely continuous systems. However, assuming that such a simulator is available, we may translate the trace fitness function defined for continuous simulations to hybrid simulations with discrete transitions.

EXAMPLE 4

A system state consists of two position variables x and velocity variables v, modeling a vehicle's position inside 3×4 planar grid where each cell in the grid has a desired velocity given by a unit vector g(i,j) for each cell (i,j). The dynamics of the system inside a grid are given by $\dot{x}=v$, $v=A(v-g(i,j))$.

Figure 6:
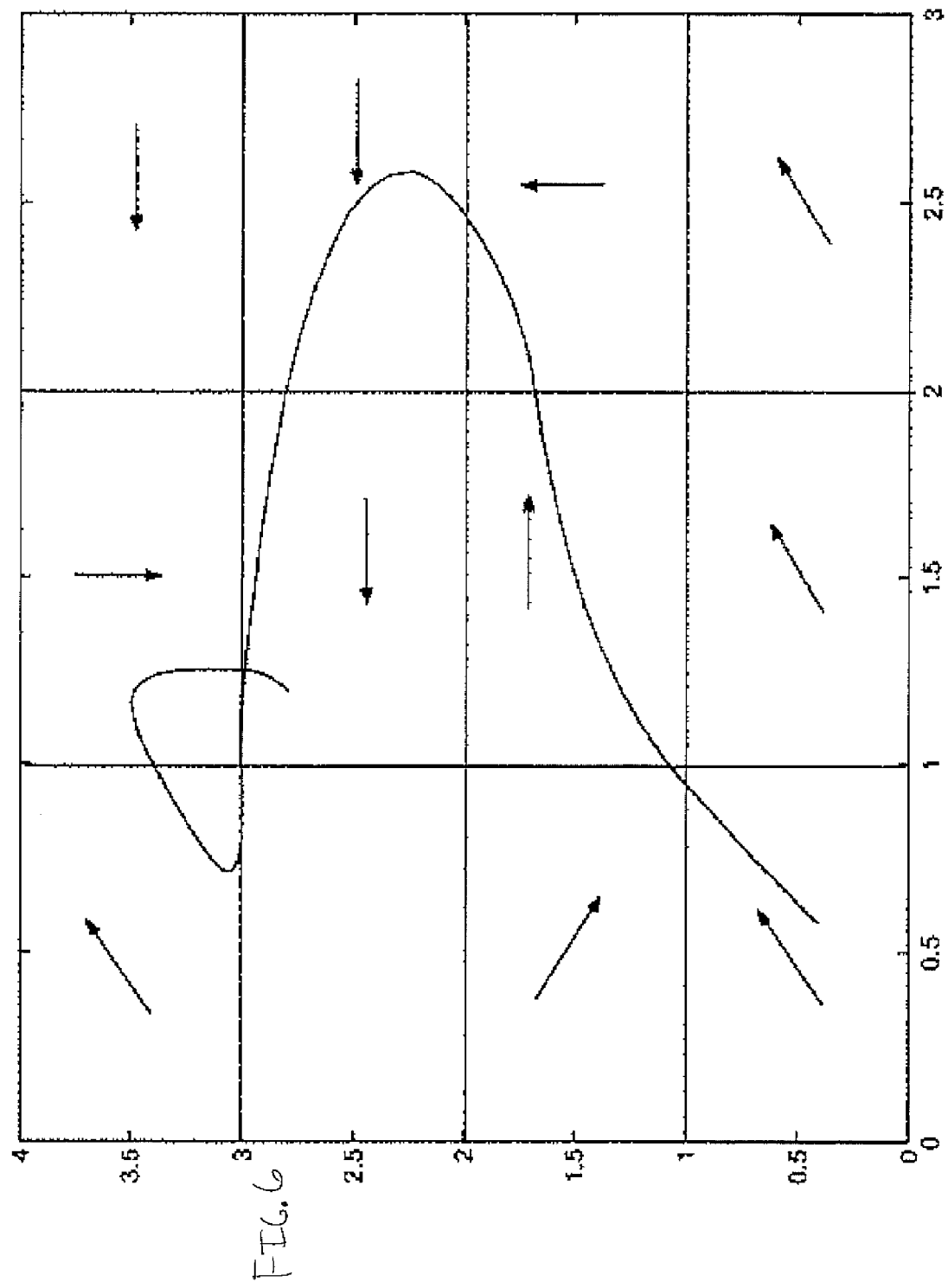
FIG. 6 is a diagram showing position (x) and velocity (v) trajectories in the vehicle example 4.

FIG. 6 shows the direction of g(i,j) in each cell. The value of g(i,j) varies according to the current cell (or discrete mode) of the system. The system starts from cell (1, 1). Our goal is to reach as close as possible to the point (1,3) with a velocity as close as possible to (0,0). The optimal trajectory is shown in FIG. 6.

Simulink/Stateflow Models: an application of the techniques described thus far may be applied to tools to detect concrete violations of safety assertions and improve test coverage in Simulink/Stateflow models using exhaustive depth-bounded symbolic execution amid Monte-Carlo sampling. Simulink/Stateflow models are the de-facto industry standard in the design of control software in domains such as automotive software. These models combine discrete as well as continuous transitions and are roughly equivalent to Hybrid automata. In practice, however, translating these models to hybrid automata results in a blowup in the number of discrete modes. Secondly, any translation requires assumptions about the semantics of the models, which are not stated clearly by the developers of Simulink/Stateflow. The present approach avoids building the hybrid automaton model explicitly. Instead, it considers such a model implicitly by identifying and tracking mode-change indicators along each execution. These indicators include outcomes of a comparison operation true/false, table lookup operation (which rows were used to interpolate), stateflow transition (which guards were satisfied), choice of a particular option of a multiplexer (which option) and so on. Such mode indicators will normally cause mode changes in an explicitly constructed automaton model.

Definition 5 (Fail distance). Let be a comparison operation performed by a concrete trace c at some step i>0 with a fixed outcome $c_i(s)$ true/false. The fail distance of the comparison w.r.t. to the outcome $c_i$ is given by the concrete value $\|s-t\|$. The fail distance w.r.t to the opposite outcome $\tilde{}c_i$ is defined as $-\infty$ (a small negative quantity).

The fail distance for a comparison w.r.t a particular outcome measures how close a trace is to falsifying that comparison. Given two traces c, e that perform the same sequence of comparisons, the fail distance $f_c(c')$ of trace c' that is compatible with c, is given by the product of the fail distance of all the comparisons $s_i \geq t_i$ in c' w.r.t the outcomes defined by c for the very same comparison. The fail distance for incompatible trace is $-\infty$. As a result, incompatible traces will have a fail distance of $-\infty$. Compatible traces will always have a non-negative fail-distance. Two traces $c_i$, $c_j$ that are compatible with c but with $f_c(c_i) < f_c(c_j)$ indicates (empirically) that $c_i$ is closer to violating some of its comparisons than $c_j$.

Given $\phi_c$ corresponding to a simulation c which encounters non-linear blocks, we perform a Monte-Carlo simulation using the fail-distance metric $f_c$ over traces as defined above. Sampling according to metric ensures that the generated samples are as incompatible with the original trace c as possible.

Extending Simulation Depth: Even if a given model does not contain non-linearities, the depth bound in our model severely restricts the covered transitions in practice. Let c be a concrete simulation carried out for a large depth D that is symbolically executed up to a smaller depth d<<D with a resulting constraint $\phi_c$. Following the linearity of the model, the solutions of $\phi_c$ are all guaranteed to be compatible with c up to depth d. However, such solutions need not be compatible beyond this depth cutoff.

To extend coverage, we wish to explore concrete simulations by choosing inputs from $\phi_c$ that are incompatible with the original concrete simulation beyond the symbolic simulation depth d. Again, this is achieved by simply extending the fail-distance metric $f_c(c')$ to consider simulations beyond depth d, up to a larger depth D. The metric "rewards" traces that deviate from the original simulation c while punishing traces that are fully compatible with c.

Figure 7:
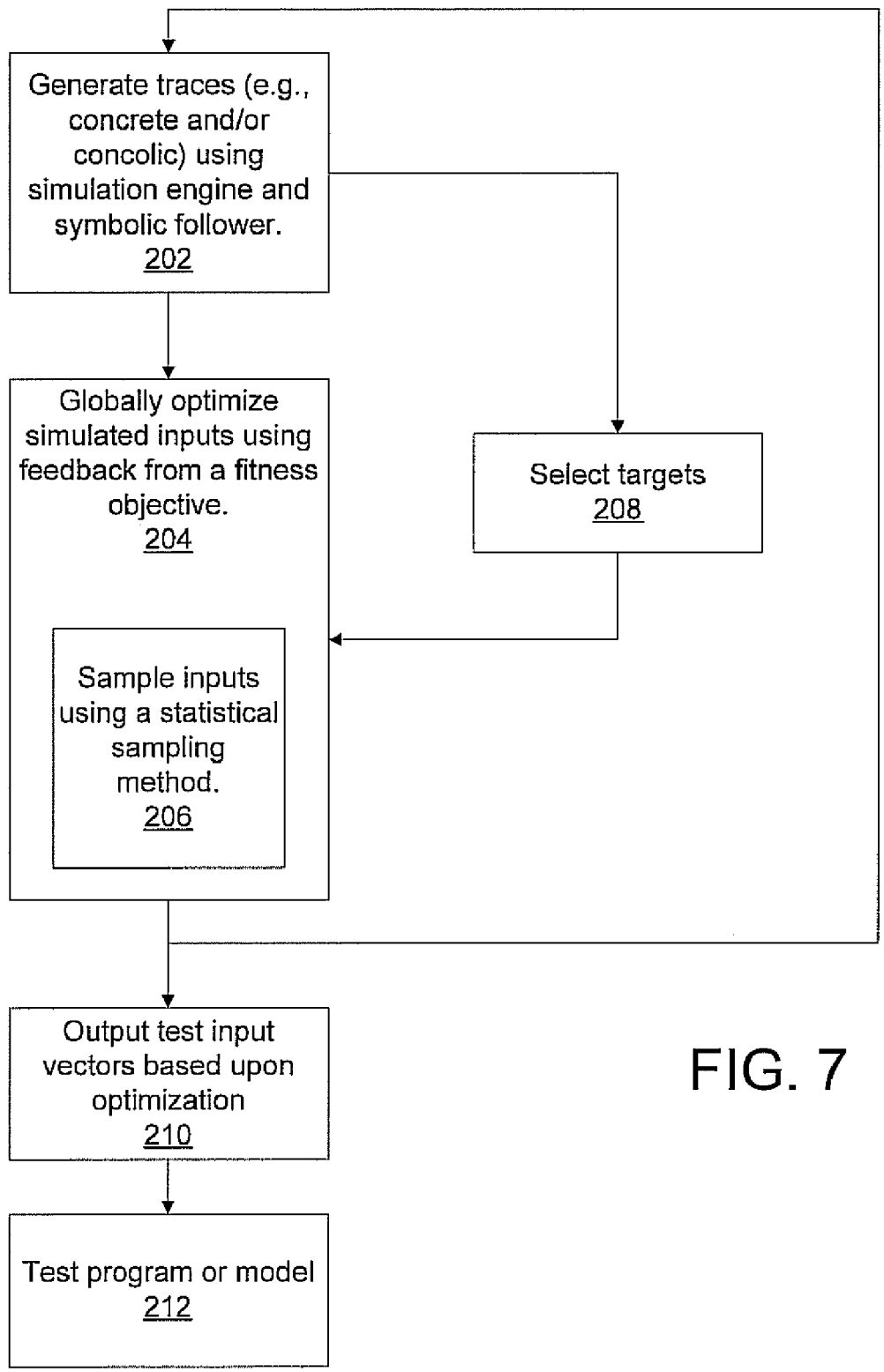
FIG. 7 is a block/flow diagram showing a system/method for test vector generation in accordance with one illustrative embodiment.

Referring to FIG. 7, a method for generating test vectors is illustratively depicted. In block 202, traces of a system model or program are generated using a simulation engine and stored in memory. The model or program includes a discrete-continuous system or may include a hybrid discrete-continuous space, which are suitable for cyber-physical systems. As such the traces may include concolic or partially symbolic traces and/or concrete traces.

In block 204, simulated inputs are globally optimized using a fitness objective computed using a computer processing device. The simulation inputs are adjusted in accordance with feedback from the traces and fitness objective values by computing a distance between the fitness objective value and a reachability objective. The global optimization includes receiving feedback from the traces and updated fitness values to compare the updated fitness values to the reachability objectives such that an input vector set is steered to an improved set of input vectors in accordance with constraints. The constraints may be user-defined. The constraints may relate to the constraint $\phi_c$. The constraint $\phi_c$ may include a restriction of the input state space, which is employed to generate similar but different traces. The constraint $\phi_c$ is designed to limit regions of state-space that are sampled and may include a formula, rule or conditional adjustments for statistically sampling the simulated inputs.

In block 206, the globally optimization includes sampling inputs to minimize the fitness objective value using a failed distance method, a Monte Carlo method, a Hit-and-Run Monte-Carlo method or other statistical sampling.

In block 205, the reachability objectives are determined by a target selection module configured to output test input vectors for testing the model or program.

In block 210, test input vectors are output based upon the simulated inputs associated with optimized fitness objective values. The test input vectors are configured to test the system model or program stored in memory. In block 212, the system model or program is tested by answering the reachability questions. Reachability questions are answered by searching for safety violations that include non-linear dynamics using sampling in a state-space.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope and spirit of the invention as outlined by the appended claims. Having thus described aspects of the invention, with the details and particularity required by the patent laws, what is claimed and desired protected by Letters Patent is set forth in the appended claims.

What is claimed is:

1. A method for generating test vectors in cyber-physical systems, comprising:
    generating traces of a system model combining discrete and continuous state components as a dense-time model stored in memory using a simulation engine by using a computer processor;
    globally optimizing simulated inputs using a fitness objective computed using the computer processor, the simulation inputs being sampled in regions of state-space and being adjusted in accordance with feedback from the traces and fitness objective values by computing a distance between the fitness objective value and a reachability objective;
    searching for safety violations of systems that include non-linear dynamics using sampling in the state space; globally optimizing by use of a failed distance to compute a fitness value and a "Hit-and-Run" Monte-Carlo based sampling in a hybrid discrete continuous space; wherein globally optimizing includes sampling inputs to minimize the fitness objective value using a failed distance method, wherein globally optimizing further includes receiving feedback from the traces and updated fitness values to compare the fitness values to the reachability objectives such that an input vector set is steered to an improved set of input vectors in accordance with a constraint to limit regions of state space that are sampled;
    testing a system model or a program by answering reachability questions for the system model or program by searching for safety violations that include non-linear dynamics by sampling in the state-space; and
    using the processor, outputting test input vectors based upon optimized fitness objective values associated with the simulated inputs to test the system model or program stored in memory.

2. The method as recited in claim 1, wherein globally optimizing includes sampling inputs to minimize a fitness objective value using a Hit-and-Run Monte-Carlo based sampling.

3. The method as recited in claim 1, wherein the traces include partially symbolic traces and concrete traces.

4. The method as recited in claim 1, wherein the reachability objectives are determined by a target selection module configured to output test input vectors for testing a program.

5. The method as recited in claim 1, wherein the constraints are user-defined.

* * * * *